United States Patent [19]

Rezaei

[11] Patent Number: 5,325,305
[45] Date of Patent: Jun. 28, 1994

[54] AUTOMATED SETUP VERIFICATION SYSTEM

[75] Inventor: Fredrick F. Rezaei, Euless, Tex.
[73] Assignee: The Boeing Company, Seattle, Wash.
[21] Appl. No.: 919,308
[22] Filed: Jul. 24, 1992
[51] Int. Cl.⁵ .............................................. G06F 15/46
[52] U.S. Cl. ...................................... 364/468; 29/832
[58] Field of Search ............................ 364/468, 478; 29/830–832

[56] References Cited

U.S. PATENT DOCUMENTS

| | | | |
|---|---|---|---|
| 3,760,484 | 9/1973 | Kowalski | 29/203 B |
| 4,641,426 | 2/1987 | Hartman et al. | 29/839 |
| 4,776,088 | 10/1988 | Biggs et al. | 29/834 |
| 4,873,764 | 10/1989 | Grimm | 29/830 |
| 4,937,934 | 7/1990 | Devera et al. | 29/840 |
| 4,985,107 | 1/1991 | Conroy et al. | 156/299 |
| 5,090,650 | 2/1992 | Donaldson et al. | 248/183 |
| 5,158,487 | 10/1992 | Varnau | 29/33 P |
| 5,163,802 | 11/1992 | Poinelli | 414/555 |
| 5,170,554 | 12/1992 | Davis et al. | 29/832 |
| 5,258,915 | 11/1993 | Billington et al. | 364/468 |

*Primary Examiner*—Jerry Smith
*Assistant Examiner*—Cameron H. Tousi
*Attorney, Agent, or Firm*—Thomas W. Hennen

[57] ABSTRACT

An automated setup verification system provides a means and method for rapidly and accurately verifying that the component feeder magazines on a surface mount technology placement machine are correctly installed for manufacturing a selected printing wiring assembly. The system prevents manufacture until machine setup is verified correct, thus preventing manufacture of a large number of defective assemblies when there has been erroneous placement of component feeder magazines. The system comprises a local area controller which contains design and machine information, a programmable logic controller, a bar code scanning and proximity detection system, a test station for testing a sample component from a component feeder magazine, and a structural bridging and spanning assembly for adapting the invention to an existing surface mount technology placement machine. An operator associates a component to a component reel and a component feeder magazine in the local area controller using a bar code system. The loaded component feeder magazines installed on a placement machine are scanned to verify their positions are correct. Any incorrectly positioned component feeder magazines are indicated to the operator for repositioning prior to manufacturing information being downloading to the surface mount technology placement machine.

9 Claims, 5 Drawing Sheets

AUTOMATED SETUP VERIFICATION SYSTEM

BACKGROUND OF THE INVENTION

1. Field of the Invention

This invention pertains to the field of automated manufacturing equipment, and more particularly relates to automated equipment for verifying that an automated manufacturing machine is correctly configured prior to operating the automated manufacturing machine to produce assemblies at a high rate.

2. Description of the Related Art

In the electronics manufacturing industry, surface mount technology placement machines capable of placing electronic components on printed wiring assemblies during automated assembly line production at rates as high as 14,000 electronic components per hour are common. Such machines typically utilize as many as 140 or more different electronic component feeder magazines arranged in a predetermined order to maintain such a high production rate.

In such a machine it is important that the correct electronic component be loaded in each component feeder magazine and that each component feeder magazine be loaded in the correct sequence on the placement machine. Only in this way will the printed wiring assembly data set, which controls printed wiring assembly manufacture and electronic component placement cause the placement machine to accurately place the correct electronic component in the correct position on each assembly.

In order to perform manufacturing at high production rates, the placement machine feeder magazine configuration must be free of error. Manually checking 140 different component feeder magazines to ascertain that the correct electronic component is loaded in each component feeder magazine and that each component feeder magazine is correctly positioned on the placement machine is time consuming and prone to error. Failure to verify that the setup is correct before beginning production risks producing a large number of defective printed wiring assemblies before the error can be discovered and corrected.

Some manufacturers of surface mount technology placement machines have sought to deal with this problem by including apparatus to test each component before it is placed on the printed wiring assembly to insure the correct component is being placed. Components are typically quite small, and testing equipment must be quite sophisticated and consequently expensive. This approach slows the production rate by a factor of 60 percent or more, and is generally unsatisfactory for this reason.

Other manufacturers have included electronic circuitry, usually a semiconductor chip bearing an identification code or programmable circuitry, within each component feeder magazine. This allows the placement machine to interrogate each component feeder magazine, usually using a gold finger contact connection, and determine that each component feeder magazine is in its correct location. This system requires that each component feeder magazine be dedicated to loading one component part number so that a given component feeder magazine always contains the same component part. This system has no way of checking which part is in which magazine, other than having the operator manually check. Including programmability within component feeder magazines increases the cost and complexity of the component feeder magazine, but does not guarantee the correct component is loaded within that feeder magazine.

SUMMARY OF THE INVENTION

The various approaches used by surface mount technology placement machine manufacturers to deal with the need for correctly setting up their machines prior to production have resulted in complex and expensive component feeding magazines and reduction of component placement speed. These problems are overcome in the present invention which provides simple component feeder magazines coupled with maximum component placement speed which is not limited by the need to test each component or interrogate each component feeder magazine as the production of printed wiring assemblies proceeds.

These advantages are achieved in the present invention by providing an automated system which forces the operator to test a sample component from each component feeder reel and create a logical link in a local area controller to record which component reel is loaded into which component feeder magazine. The present invention works on the assumption that a tape of components wound on a reel contains parts all having the same part number. A local area controller stores a printed wiring assembly data set for each printed wiring assembly which is to be manufactured. The present invention uses bar codes and an intelligent controller communicating with the local area controller to compare the actual component feeder magazine setup configuration with that specified in a printed wiring assembly data set. The present invention scans bar codes on each component feeder magazine to verify that all necessary component feeder magazines are present and each component feeder magazine is correctly positioned to produce a given printed wiring assembly, according to the data set for that assembly.

The automated setup verification system prevents production from beginning until all component feeder magazines have been demonstrated to contain the correct electronic component and to be correctly positioned on the surface mount technology placement machine. When there is an indication from the automated setup verification system that all is in correct order, production may proceed at the limit of machine rate. The setup verification process typically takes less than one minute to complete if all components and magazines are correctly placed.

Accordingly, it is an object of this invention to provide a fast and accurate means for verifying that a surface mount technology placement machine has been correctly setup to produce a selected printed wiring assembly. It is also an object of this invention to prevent production from beginning until all component feeder magazines have been correctly loaded and placed in proper sequence on the surface mount technology placement machine. It is yet another object of this invention that the setup be verified with a minimum of operator intervention.

BRIEF DESCRIPTION OF THE DRAWING

These and other objects of the invention will be better understood when the following specification is studied in conjunction with the appended drawing figures wherein.

DETAILED DESCRIPTION OF THE PREFERRED EMBODIMENT

Figure 1:
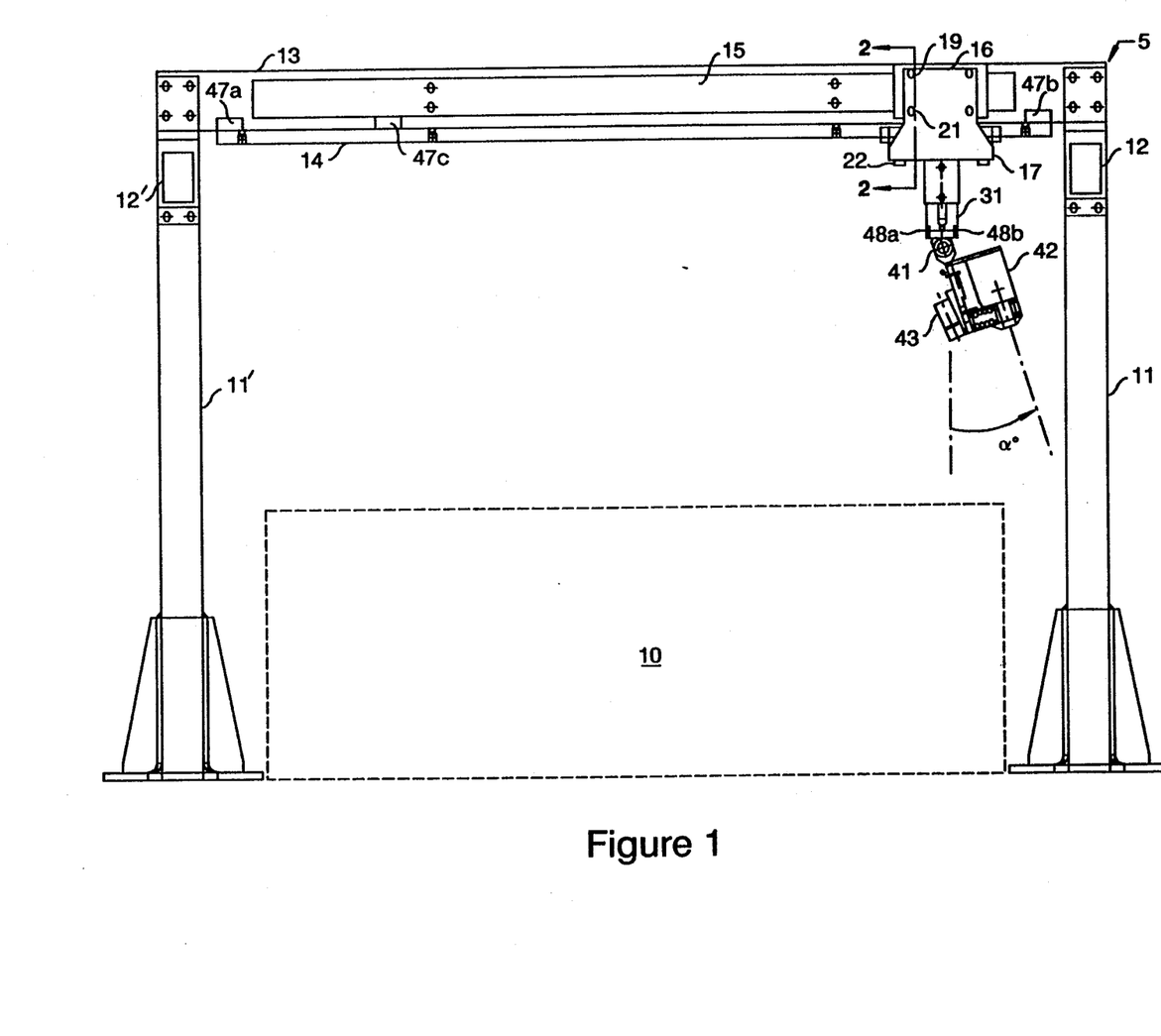
FIG. 1 is an elevation view of the support structure and the scanning components of an automated setup verification system according to the invention.

Referring now to the drawing wherein like parts and elements are designated by like reference characters throughout the several figures, and in particular referring to FIG. 1, there is shown a mechanical support structure 5 which bridges and spans a surface mount technology placement machine 10 (Fuji CPIII Surface Mount Technology (SMT) placement machine or equivalent) shown in phantom. Mechanical support structure 5 may comprise any number of upright support posts 11 and 11' depending upon the support requirements of a particular installation. Support posts 11 and 11' may be any sort of column such as an "I" beam or tubing or other conventional structural shape.

Steel is a convenient structural material for use in mechanical support structure 5, although many other materials, including but not limited to aluminum, a structural composite material, or even wood could be used. The components of mechanical support structure 5 may be joined by any conventional mechanical fastening technique, such as welding, bolts, screws, rivets, or even adhesives, provided a rigid structure is obtained. A support structure utilizing tightly strung cables is not beyond the realm of possibility.

As illustrated in FIG. 1, one end of mechanical support structure 5 has a pair of support posts 11 and the other end has a pair of support posts 11', each member of each pair is oriented vertically and spaced apart from the other member of that pair, one on either side of placement machine 10, for a total of four support posts. As illustrated in FIG. 1, each background support post is aligned with and hidden behind a foreground support post at each end of mechanical support structure 5. The arrangement of the support post pairs 11 and 11' describe a rectangle when viewed from above.

Bridging between members of each support post pair 11 and 11' at each end of mechanical support structure 5 are bridging members 12 and 12' which are illustrated as having a tubular sectional shape but which could have an "I" or any other common structural shape. Bridging members 12 and 12' are each rigidly attached on each end to one member of each support post pair 11 and 11' respectively. Spanning between the approximate midpoints of bridging members 12 and 12' is a single spanning member 13. Again, spanning member 13 is illustrated as having a tubular section, but could have an "I" or any other common structural shape.

Linear slide bearing 14 is shown in FIG. 1 rigidly attached to the bottom of spanning member 13. Load mounting bracket 17, shown in more detail in FIG. 2, attaches to linear slide bearing 14 and is adapted for low friction movement along linear slide bearing 14.

Platen 15 is attached to spanning member 13 and is essentially coextensive with linear slide bearing 14. Linear motor 16 operates on platen 15 to provide motive force parallel with linear slide bearing 14 along spanning member 13. Linear motor 16, which can be a stepper motor, operates on the vertical face of platen 15 in a known manner to provide force and movement along spanning member 13. Linear motor 16 is attracted to platen 15 by a permanent magnet, and is held away from contact with platen 15 by an air bearing provided by compressed air as is more fully explained below. Linear motor 16 is supported in the vertical plane by two roller bearings 18 spaced from one another in the direction along platen 15, which bear against the top of platen 15.

Figure 2:
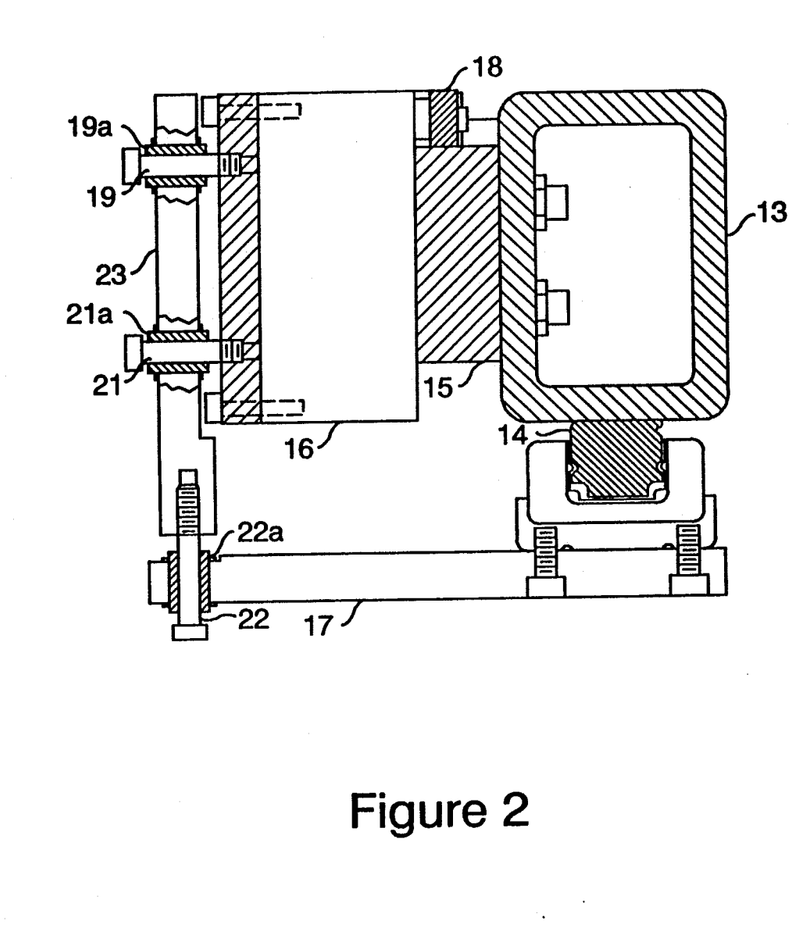
FIG. 2 is a sectional view along line 2—2 in FIG. 1, of a linear motor mounting design in accordance with the invention.

Load mounting bracket 17 is mounted to linear slide bearing 14 for longitudinal movement along linear slide bearing 14. Side member 23 has four instances of vertical precision linear bearing 22 rigidly attached which project downwardly through bushing 22a in load mounting bracket 17. Side member 23 is thus constrained to limited vertical motion relative to load mounting bracket 17 by the two instances of linear bearing 22.

Mounted to linear motor 16 are two instances of upper horizontal precision linear bearing 19 and two instances of lower horizontal precision linear bearing 21 for a total of four horizontal precision linear bearings. Upper and lower horizontal precision linear bearings 21 and 22 project through bushings 19a and 21a respectively, constraining side member 23 to limited motion relative to linear motor 16 along a horizontal axis perpendicular to spanning member 13.

The function of linear bearings 19, 21 and 22 is to couple forces parallel to the length of spanning member 13 from linear motor 16 to load mounting bracket 17, and to decouple forces from load mounting bracket 17 directed perpendicular to spanning member 13. Such perpendicular forces arising from misalignment of linear slide bearing 14 and platen 15 otherwise might cause linear motor 16 to become misaligned with and disengaged from platen 15 as it traverses from one end of platen 15 to the other.

Referring again to FIG. 1, rotary pneumatic actuator 31 is shown attached to and suspended beneath load mounting bracket 17. Rotary pneumatic actuator 31, which alternatively could be powered by electricity or hydraulic pressure as well as pneumatic pressure, provides limited rotary motion between first and second positions one hundred eighty (180) degrees of angle apart.

Flexible joint 41 attached to the bottom of rotary pneumatic actuator 31, carries bar code scanner 42 (Microscan Company brand or equivalent) and permits bar code scanner 42 to be positioned to scan at an angle alpha relative to a line perpendicular to the direction of travel of load mounting bracket 17 along linear slide bearing 14. If linear slide bearing 14 is substantially horizontal, as illustrated in FIG. 1, angle alpha may be measured relative to the local vertical. It has been found in practice that angle alpha may beneficially be set at approximately 15 degrees of angle relative to local vertical. Flexible joint 41 thereby permits bar code scanner 42 to scan at an angle to local vertical.

If flexible joint 41 is positioned at an angle to local vertical, rotary pneumatic actuator 31 permits bar code scanner to scan either ahead or behind its actual position. By rotating between first and second positions, rotary pneumatic actuator 31 enables bar code scanner 42 to scan bar codes which are beyond the limit of travel of linear motor 16 at either end of platen 15.

Figure 3:
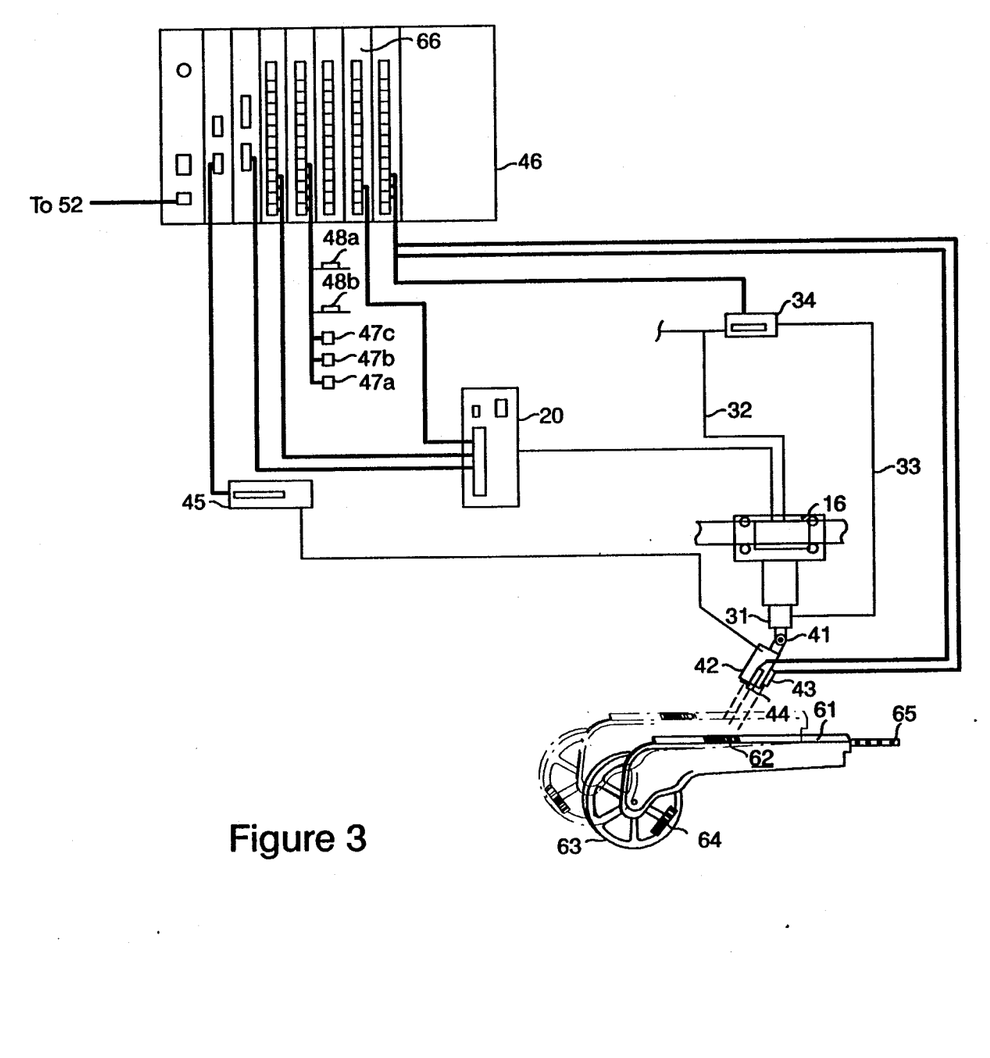
FIG. 3 is a schematic representation of some of the scanning components and a portion of the control system according to the invention.

Referring now to FIG. 3, a schematic representation of the automated setup verification system shows linear motor 16 connected electrically to motor controller 20 (Compumotor LX stepper motor drive or equivalent). Motor controller 20 has several electrical interconnections with programmable logic controller 46 (Allen Bradley brand PLC5/15 or equivalent). Programmable logic controller 46 communicates through a back plane bus to DB module 66 (Allen Bradley brand or equivalent) which is a circuit board in programmable logic controller 46.

DB module 66 then communicates with linear motor controller 20 through an RS232 connector which is an industry standard electrical connector of the type commonly used with digital equipment. The function of DB module 66 is to convert 16-bit data from the programmable logic controller to 8-bit data which is understood by linear motor controller 20. The exact number and type of electrical interconnections and other equipment required will of course depend upon the design of the electronic equipment selected for use in the invention, all of which is available commercially. If a different brand is selected, the exact equipment may be different, but the function to be performed remains the same.

Laser bar code scanner 42 is shown communicating the scanned bar code signal to bar code decoder 45 (Microscan Company brand or equivalent) which in turn is connected by an RS232 connection to programmable logic controller 46.

Linear motor 16 is supplied with pressurized air via air line 32 to provide cooling and an air bearing between linear motor 16 and platen 15. Rotary pneumatic actuator 31 receives pressurized air through air line 33. Air manifold 34 which is a pneumatic valve controls the flow of pressurized air through air line 33 according to command signals received from programmable logic controller 46 to control rotary position of pneumatic rotary actuator 31.

Proximity sensors 47a, and 47b are placed one at each end of linear bearing 14 and proximity sensor 47c is placed at an intermediate homing position. Proximity sensors 47a, 47b and 47c utilize an inductive field produced by an inverted "U" shaped member mounted on spanning member 13 and a "dog tail" projection, which could be a bolt or other simple metallic member, mounted to travel with linear motor 16 and positioned to pass between the downwardly extending legs of each inverted "U" shaped member. When the dog tail projection passes between the legs of the inverted "U" shaped member, a signal is inductively produced which indicates detection of the dog tail projection and hence linear motor 16 position. Proximity sensors 47a, 47b and 47c are common industrial products which are available commercially.

Sensors 47a and 47b mark the extreme positions of linear motor 16 so that programmable logic controller 46 and motor controller 20 may prevent linear motor 16 travel beyond the limits of sensors 47a and 47b. Sensor 47c identifies a homing position which enables programmable logic controller 46 to move linear motor 16 to a known starting point prior to beginning the scanning cycle.

Sensors 48a and 48b, which are also common industrial products which are available commercially, serve to verify to programmable logic controller 46 that rotary actuator 31 has been driven against its stop in either of its first or second positions 180 degrees of angle apart so that bar code scanner 42 will be pointed in a known direction and data provided thereby will be reliable. Sensors 48a and 48b may be inductive sensors, or they could be any of a wide variety of sensors including mechanical, electrical, infrared, acoustic or other sensing scheme so long as they provide a signal which is indicative that the rotary member has assumed its first or second position.

Laser photoelectric sensor 43 is attached to bar code scanner 42 and is aligned with bar code scanner 42. Laser photoelectric sensor serves as a proximity detector to detect and determine whether or not a component feeder magazine is present or missing at a component feeder magazine location. Information gathered by the laser photoelectric sensor 43 is communicated to programmable logic controller 46. Laser photoelectric sensor 43 is a common industrial product which is available commercially.

Laser position designator 44 is aligned with laser bar code scanner 42 to project an indicating beam of coherent light to identify the place bar code scanner 42 is directed. Laser position designator 44 thus provides a visual indication to an operator which component feeder magazine position laser bar code scanner 42 is addressing at any given moment. When laser bar code scanner 42 approaches a predefined component feeder magazine position, sensor 43 will first detect whether or not a component feeder magazine is present and if so, scanner 42 will then scan bar code 62 on component feeder magazine 61 to determine which magazine is in this position. This information is of course communicated to programmable logic controller 46.

Figure 4:
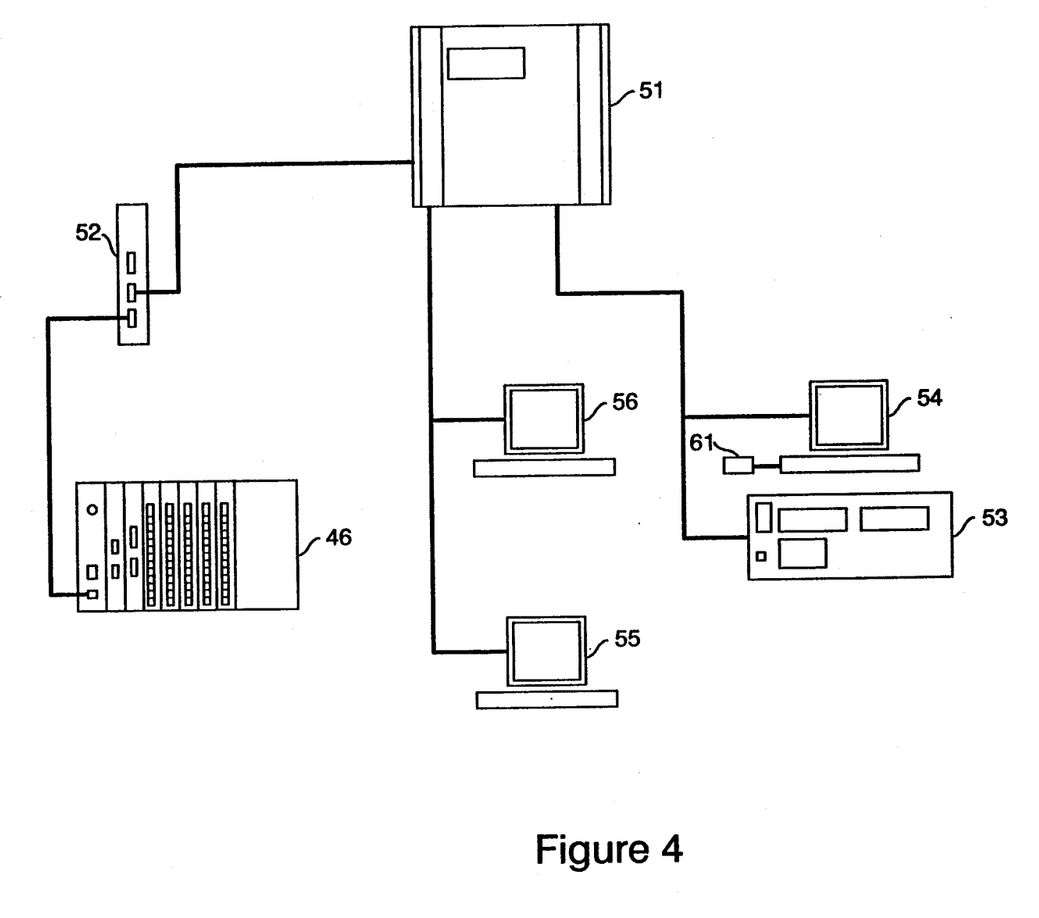
FIG. 4 is a schematic representation of the local area controller and programmable logic controller interface according to the invention.

Referring now to FIG. 4, local area controller 51, which may be any digital computer equivalent to a Micro Vax II manufactured by Digital Equipment Corporation, is connected via an RS232 connection to a KE module 52 (Allen Bradley brand or equivalent) which in turn is connected via a data bus (Allen Bradley brand Data Highway Plus Communication or equivalent) connection to programmable logic controller 46. KE module 52 is a printed wiring assembly which serves to convert a proprietary data bus protocol to an RS232 format. Of course, the need for KE module 52 will depend upon the design of the electronic control equipment selected. Other manufacturers will undoubtedly use other designs. It is only necessary that the control system chosen be able to communicate with its components in a compatible format and perform the functions disclosed herein.

Local area controller 51 has for convenience terminal 55 positioned on one side of surface mount technology placement machine 10 and a second terminal 56 placed on the other side. In addition, local area controller 51 has a test station comprising testing meter 53 (Hewlett-Packard brand LCR multimeter or equivalent) and test terminal 54 which are both connected to local area controller 51 via RS232 connections.

Test terminal 54 includes a bar code scanning wand 61 which an operator uses to manually scan bar code 64 on component reel 63 to identify which part number this component reel represents, before loading component reel 63 into component feeder magazine 61. The operator then uses bar code scanning wand 61 to scan bar code 62 on component feeder magazine 61 to create a logical link in local area controller 51 associating the identified part number with that component feeder magazine. The operator then removes one component from component reel 63 and places it in testing meter 53. Testing meter 53 measures the component's electrical value and communicates this information to local area controller 51. Local area controller 51 then compares this electrical value with the electrical values found in a library of components stored in memory. When a match is found, the component is identified to local area controller 51 and is compared with the part number represented by the identified component reel to verify that the correct part number is loaded on that reel. The assumption is that the tape wound on the component reel contains a plurality of electronic components all having the same part number. This is a safe assumption to make since such tapes come already loaded from the component manufacturer and are not subject to having components removed and replaced with others.

The present invention of course relies on automated equipment which utilizes a series of programmed instructions to carry out its function. Typically, these instructions are programmed using ladder logic programming and/or BASIC computer language programming, both of which are well known. Programming this type of equipment is relatively simple and well within the skill of the ordinary artisan. It is important that the logic of this invention be captured in that programming, but the exact series of instruction statements and parameters will vary with the style and skill of the programmer, the requirements of the particular brand of automated equipment and the programming language chosen to execute the invention.

Figure 5:
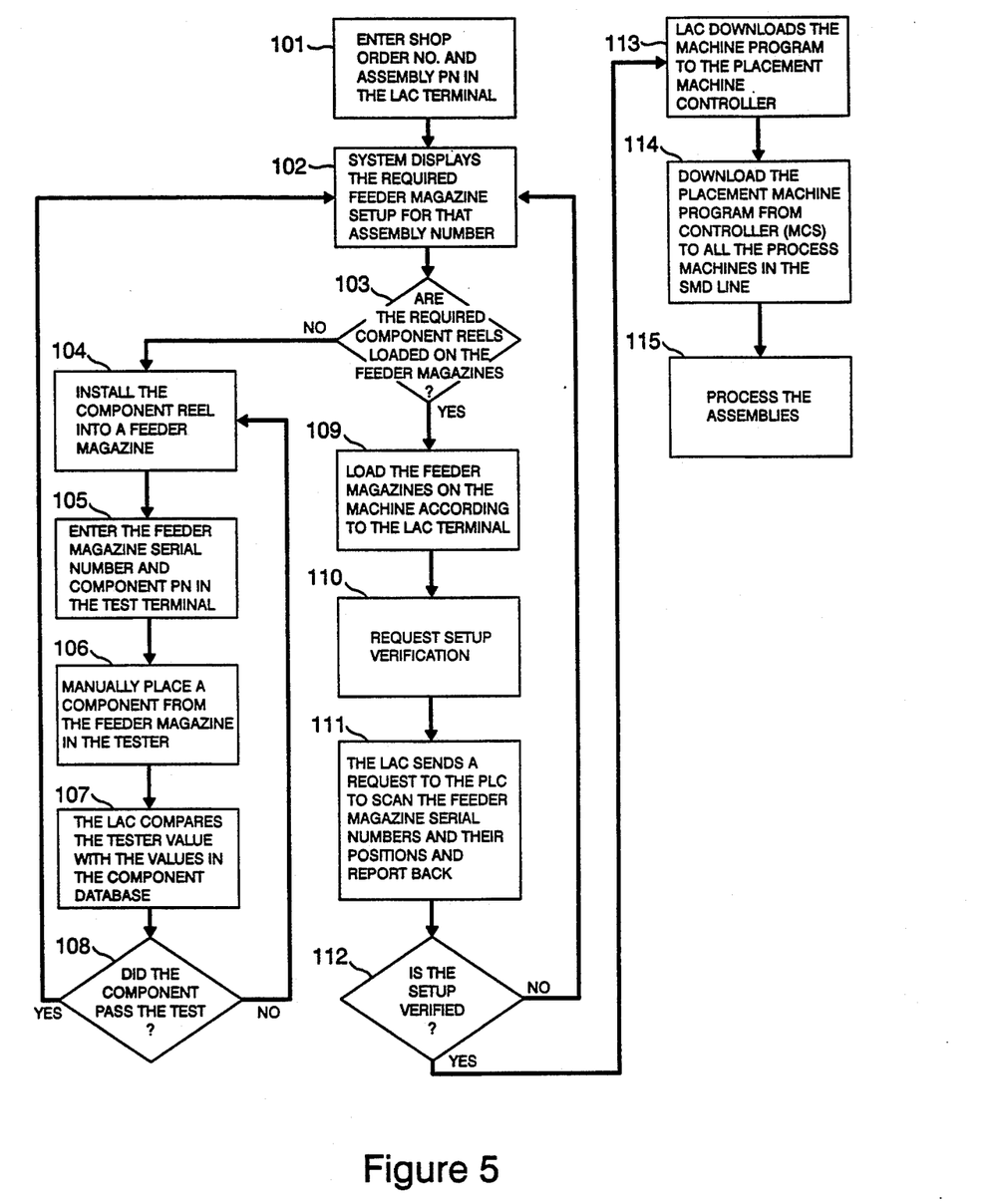
FIG. 5 is a flow diagram according to the invention.

Referring now to FIG. 5, the logic of the automated setup verification system is shown in flow diagram form. FIG. 5 necessarily combines manual operator setup steps with the automated verification steps executed by the present invention. In step 101, an operator at local area controller terminal 55 or 56 enters a shop order number and assembly part number for the printed wiring assembly the operator intends to manufacture.

In step 102, local area controller 51 then accesses its memory for the data set corresponding to the designated part number and extracts the required component feeder magazine setup in terms of component identity and component feeder magazine location for that printed wiring assembly part number.

In step 103, local area controller 51 then checks to determine whether or not it has data which indicates that the operator has scanned all the necessary component reel bar codes and component feeder magazine bar codes, and tested individual electronic components to verify that all the required component reels 63 are loaded on the component feeder magazines 61. If the answer to this inquiry is "NO", not all necessary component reels 63 bearing electronic components are associated with and loaded on component feeder magazines 61, local area controller 51 in step 104 displays the missing components and instructs an operator to load a needed component reel 63 into a component feeder magazine 61.

As shown in step 105, when the operator loads a component reel 63 into a component feeder magazine 61, the operator uses bar code scanner wand 61 to scan the component feeder magazine serial number bar code 62 and the component reel part number bar code 64 into the local area controller 51.

In step 106, the operator then manually takes a component 65 from the selected component reel 63 loaded in a component feeder magazine 61 and places it into testing meter 53.

In step 107, testing meter 53 measures the electrical characteristics of component 65 and communicates this information to local area controller 51 which then compares those electrical characteristics with the values in its electronic component library to identify by part number which component was tested. Local area controller 51 then determines in step 108 whether component 65 tests within the valid range. If the component does not test within the valid range, it is either a defective component and a second component from the same component reel 63 should be tested (returning to step 106) or perhaps if the reel has been mislabeled and does not match the component placed therein, it is an incorrect component. In the latter case, that component reel should be set aside for relabeling and a different component reel loaded into the component feeder magazine (returning to step 104).

If component 65 can be identified as a part number required to manufacture the previously identified printed wiring assembly, and is found to be within the acceptable range of electrical values for that part number, local area controller 51 records the fact that component reel 63 containing the identified component 65 part number has been loaded into component feeder magazine 61.

Local area controller 51 then returns to step 102 to recall its data and then goes to step 103 to compare its data with the actual component feeder magazine configuration to verify that all necessary component reels have been loaded onto component feeder magazines. If not, missing component reels and feeder magazines are highlighted on a display and local area controller 51 returns to step 104 and again requests the operator to install a particular component loaded on a component reel into a component feeder magazine. This process continues until all of the proper components have been loaded into magazines for all of the different components required to manufacture a particular printed wiring assembly.

Local area controller 51 again reaches step 102 and step 103 to compare the required parts list in its data set for a particular printed wiring assembly with the list of components which have been loaded into component feeder magazines to verify that all the correct components are available in magazines for loading on placement machine 10. When all necessary components have been loaded in component feeder magazines, local area controller 51 displays on its terminal screen the proper position for each component feeder magazine on surface mount technology placement machine 10 to manufacture the selected printed wiring assembly.

At step 109, the operator then manually loads the component feeder magazines onto the surface mount technology placement machine component feeder magazine locations according to instructions provided by local area controller 51. The operator, at this point having completed loading component reels into feeder magazines and having mounted those magazines onto the placement machine 10, in step 110 requests setup verification from local area controller 51.

In step 111, local area controller 51 sends a request to programmable logic controller 46 to scan the component feeder magazine serial numbers as indicated by their bar codes correlated with their actual positions on the surface mount technology placement machine and to report back to the local area controller 51 the identity and location of each component feeder magazine. The programmable logic controller then activates the laser bar code scanner 42, the laser photoelectric sensor 43 and the laser position designator 44 and causes linear motor 16 and rotary actuator 31 to operate appropriately so that laser bar code scanner 42 may read each bar code on each component feeder magazine at each location on the machine.

As each bar code is scanned, the scanned signal is provided to bar code decoder 45 which communicates to the programmable logic controller 46 the bar code value that has been scanned. This information is correlated in local area controller 51 with the current position of linear motor 16 to identify which component feeder magazine position on the placement machine is being addressed. When this information has been obtained, local area controller 51, in step 112, compares the scanned information with the information which accompanies the printed wiring assembly part number data set in the local area controller memory and determines whether or not the actual component feeder magazine configuration corresponds with that required by the data set.

If the answer is NO, the system returns to step 102 displays the component feeder magazine positions which are incorrect and prompts the operator to correct the component feeder magazine positions. When and only when the setup is verified as correct, local area controller 51 proceeds to step 113 and downloads the surface mount technology placement machine program for the selected printed wiring assembly to the placement machine controller (not shown). In step 114, the placement machine controller is instructed by local area controller 51 to download the placement machine program from the placement machine controller to all the process machines in the Surface Mount Device (SMD) assembly line, so that in step 115 production may begin and printed wiring assemblies begin to be assembled.

Bar code scanner 42 and bar code scanner 61 utilized in the present invention each have a scanner head which is separate from the bar code decoder. This scanner scans at a rate of approximately 400 scans per second. Of course, any bar code scanner could be used, provided it is compatible with and is able to read the bar codes used and is physically capable of being mounted to the mechanical scanning apparatus of the present invention. It is not necessary that the decoder portion of the bar code scanner be separate from the scanner head and they could be both combined in a single unit. Separating the decoder from the scanning head simply means that when this invention was reduced to practice, less mass needed to be suspended under rotary actuator 31.

The bar codes used in the present invention are what is known as "three of nine" type bar codes wherein there must be three or more black columns in order to produce a valid bar code. Several other well known bar code formats could be used and this invention should not be limited to a "three of nine" type bar code.

The programmable logic controller 46 used by the inventor was a 16 bit Allen-Bradley brand programmable logic controller. Linear motor controller 20 used by the inventor was a CompuMotor brand LX drive, which operates on 8-bit serial data. It is a utility device used to translate motion commands for linear motor 16. DB Module 66 is an Allen-Bradley brand circuit card inside programmable logic controller 46 which accepts digital programming in a version of the BASIC computer language. DB Module 66 allows communication between the programmable logic controller 46 and the LX drive 20 which controls linear motor 16 by converting 16-bit data commands to 8-bit data commands. Equipment from other manufacturers may work equally well in the present invention and it is only necessary that equipment that is compatible and functionally equivalent be selected.

One of the useful features of the present invention is that it conveniently and rapidly scans surface mount technology placement machine 10 to obtain data regarding the actual component feeder magazine setup configuration, compares this actual information with the required setup configuration in a data set, and provides a notification of any discrepancies to an operator.

In normal operation, local area controller 51 takes computer aided design data describing the printed wiring assembly and post processes this data to extract a machine program to correctly place parts on printed wiring assemblies during manufacture and constructs a table of component feeder magazine locations. This post processing takes approximately ten minutes and has the advantage of being error free since it is performed by a digital computer and not a human operator. Local area controller 51 provides central storage for the machine program and provides revision control so that the program may be modified by an operator.

Some surface mount technology placement machines provide as many as 140 positions for component feeder magazines. Other placement machines may have a smaller number of magazine positions, while some may have more. Any particular printed wiring assembly may require all 140 or more positions to be filled by magazines or it may require a lesser number. Many of the positions may be left empty, depending on the design of the printed wiring assembly which is being manufactured.

Typically in placement machines of this type, individual electronic components 65 are mounted to a tape which is wound around the component reel 63, mounted in a component feeder magazine 61. Each component feeder magazine 61 is loaded on surface mount technology placement machine 10 in a predefined position. Surface mount technology placement machine 10 removes each component one by one from the tape and places it at a specified location on a partially assembled printed wiring assembly. Placement machine 10 secures the component in place by depositing a small amount of adhesive on the printed wiring assembly board. The manufacturing process proceeds to cure the adhesive and finally solder the component to the printed wire assembly using wave solder or vapor phasing technology which are both well known techniques in the electronics industry.

An acceptable laser photoelectric scanner 43, which is used as a proximity sensor in the present invention, is manufactured by the Omron Company of Japan, although any equivalent device could be used. Laser position designator 44 in the present invention is a type commonly available from Edmond Scientific Company, although again any equivalent device could be used. There is a wide range of commercially available equivalent products which could be substituted.

Other improvements, modifications and embodiments will become apparent to one of ordinary skill in the art upon review of this disclosure. Such improvements, modifications and embodiments are considered to be within the scope of this invention as defined by the following claims.

I claim:

1. An automated setup verification system for use in verifying manual operator setup of a placement machine having a plurality of component feeder magazines, each containing a plurality of preselected electronic components, and arranged in fixed positions for use in the automated placement of said electronic components on assemblies during the assembly manufacturing process, comprising:

a support structure positioned adjacent said placement machine and defining a path which passes by each of said fixed positions;

a plurality of coded means, each of said coded means being attached to a different one of said component feeder magazines for identifying and distinguishing each of said component feeder magazines from all other component feeder magazines in said placement machine;

an electronic component testing meter, for manually testing the electrical values of one or more of said plurality of preselected electronic components contained within each component feeder magazine bearing one of said coded means, to determine the identity of said plurality of electronic components;

an electronic component testing terminal including code reading means, for associating an identified plurality of electronic components contained within a component feeder magazine with that particular component feeder magazine;

movement producing means movably retained to said support structure for producing selective motion relative to said support structure along said path in response to control commands;

code sensing means attached to said movement producing means for addressing and sensing coded means in each fixed position; decoding means communicating with said code sensing means for discerning the coded identity addressed by said code sensing means of any component feeder magazine found in any fixed position;

a programmable logic controller communicating with said decoding means and said movement producing means, and programmable for sending control commands to said movement producing means, and for receiving information from said decoding means; and a local area controller communicating with said programmable logic controller, said electronic component testing meter and said electronic component testing terminal, and having stored information defining at least one preselected assembly data set which includes a required component feeder magazine setup for manufacturing as assembly, said local area controller being programmed to compare actual component feeder magazine setup information provided by said programmable logic controller, said electronic component testing meter, and said electronic component testing terminal with said required component feeder magazine setup information, and provide a visual indication to an operator to verify whether said actual component feeder magazine setup conforms to said required component feeder magazine setup.

2. An automated setup verification system as set forth in claim 1, further comprising:

a rotary member attached to said movement producing means and supporting said code sensing means and responsive to control commands from said programmable logic controller for rotating about an axis between first and second positions relative to said movement producing means.

3. An automated setup verification system as set forth in claim 1, further comprising:

a proximity sensor attached to said code sensing means and communicating with said programmable logic controller for sensing the presence of a component feeder magazine in one of said fixer positions.

4. An automated setup verification system as set forth in claim 1, further comprising:

a position designator attached to and aligned with said code sensing means for visually indicating to an operator which fixed position the code sensing means is addressing.

5. An automated setup verification system as set forth in claim 2, further comprising first and second sensors communicating with said programmable logic controller and positioned for detection of said rotary member position in said first and second positions.

6. An "automated setup verification system as set forth in claim 5, wherein said first and second sensors comprise laser photoelectric sensors.

7. An automated setup verification system as set forth in claim 1, wherein said movement producing means comprises an electric linear stepper motor.

8. An automated setup verification system for use in verifying manual operator setup of a surface mount technology placement machine of the type having a plurality of component feeder magazines arranged in fixed positions for use in the automated placement of electronic components on printed wiring assemblies during the printed wiring assembly manufacturing process, comprising:

a plurality of coded means, each being associated with and attached to a different one of said component feeder magazines for identifying and distinguishing each of said component feeder magazines from all other components feeder magazines in said surface mounted technology placement machine;

a support structure positioned adjacent said surface mount technology placement machine and defining a path which passes by each of said component feeder magazine fixed positions;

movement producing means movably retained to said support structure for producing selective incremental motion along said path in response to control commands;

a rotary member attached to said movement producing means and responsive to control commands for rotational movement about an axis between first and second positions;

a proximity sensor attached to said rotary member for sensing the presence of a component feeder magazine in each component feeder magazine fixed position as said movement producing means moves along said path;

code sensing means attached to said rotary member for addressing each magazine fixed position and sensing coded information from any coded means found there and for providing signals characteristic of said found coded means;

decoding means communicating with said code sensing means for processing signals for said code sensing means and discerning the identify of said found coded means;

a position designator attached to said rotary member for providing a visual indication to an operator which component feeder magazine fixed position the code sensing means is addressing;

a programmable logic controller communicating with said decoding means, said movement producing means, said rotary member and said proximity sensor, and programmed for sending control commands to said movement producing means and said rotary member, and for receiving information from said proximity sensor and said decoding means;

a test console including code reading means for identifying representative components loaded in a particular component feeder magazine by testing the electrical values of those representative components and reading the coded means on that particular component feeder magazine; and a local area controller communicating with said programmable logic controller, said test console and said surface mount technology placement machine, and having memory means for storing manufacturing information defining at least one preselected printed wiring assembly data set including a required surface mount technology placement machine component feeder magazine setup for manufacturing a preselected printed wiring assembly, and a library of electronic component values, for comparing actual component feeder magazine setup information provided by said programmable logic controller and said test console with said required component feeder magazine setup to verify said actual component feeder magazine setup conforms to said required component feeder magazine setup, for notifying the operator when the actual setup does not comply with the required setup, and for downloading manufacturing information to said surface mount technology placement machine when the component feeder magazine setup has been verified as correct.

9. A method for automatically verifying manual operator setup of a placement machine having a plurality of component feeder magazines coded with a distinguishing sensible marking and arranged in fixed positions for use in the automated placement of components on assemblies during the assembly manufacturing process, comprising the steps of:

recalling assembly design information including required component identify for a selected assembly, and required placement machine component feeder magazine setup information for manufacturing that assembly;

associating component identify information with component feeder magazine identity information for the component feeder magazine in which said component has been loaded;

first comparing actual component identity information with required component identity information to verify all required component part numbers are available in component feeder magazines;

informing an operator and returning to said associating step if said first comparing step indicates one or more required components are not available in component feeder magazines;

scanning actual component feeder magazine identity at each fixed position; p1 correlating said actual component feeder magazine identity with actual component feeder magazine position on said placement machine;

second comparing required component feeder magazine setup position information with actual component feeder magazine setup position information;

informing an operator, and returning to said scanning step if said second comprising step indicates one or more required component feeder magazines are not in the required position; and confirming that all necessary components are loaded in component feeder magazines and that all component feeder magazines are correctly placed on a placement machine to produce an assembly.

* * * * *